12) United States Patent
Cohen et al.

(10) Patent No.: US 9,495,244 B2
(45) Date of Patent: *Nov. 15, 2016

(54) DYNAMIC PER-DECODER CONTROL OF LOG LIKELIHOOD RATIO AND DECODING PARAMETERS

(71) Applicant: Seagate Technology LLC, Cupertino, CA (US)

(72) Inventors: Earl T. Cohen, Oakland, CA (US); Yunxiang Wu, Cupertino, CA (US); Alexander Hubris, San Jose, CA (US); Christopher Brewer, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/967,933

(22) Filed: Dec. 14, 2015

(65) Prior Publication Data

US 2016/0098318 A1   Apr. 7, 2016

Related U.S. Application Data

(63) Continuation of application No. 14/092,215, filed on Nov. 27, 2013, now Pat. No. 9,213,600.

(60) Provisional application No. 61/902,407, filed on Nov. 11, 2013.

(51) Int. Cl.
*H03M 13/11* (2006.01)
*G06F 11/10* (2006.01)
*G11C 29/52* (2006.01)
*H03M 13/45* (2006.01)

(52) U.S. Cl.
CPC .......... *G06F 11/1068* (2013.01); *G11C 29/52* (2013.01); *H03M 13/45* (2013.01)

(58) Field of Classification Search
CPC ..................................................... H03M 13/11
USPC ......................................... 714/780, 763, 758
See application file for complete search history.

(56) References Cited

U.S. PATENT DOCUMENTS

| | | | |
|---|---|---|---|
| 5,815,482 A * | 9/1998 | Rope | G06F 3/0613 369/112.05 |
| 7,196,644 B1 * | 3/2007 | Anderson | H04L 25/0292 341/118 |
| 7,289,574 B2 * | 10/2007 | Parolari | H04L 1/0003 375/259 |
| 7,321,643 B2 | 1/2008 | Chang et al. | 375/341 |
| 7,555,071 B2 | 6/2009 | Sontowski | 375/341 |
| 7,843,497 B2 | 11/2010 | Conley | 348/239 |
| 8,151,082 B2 | 4/2012 | Flynn et al. | 711/202 |
| 8,195,912 B2 | 6/2012 | Flynn et al. | 711/202 |
| 8,301,979 B2 | 10/2012 | Sharon et al. | 714/763 |
| 8,578,239 B2 | 11/2013 | Katayama et al. | 714/758 |
| 2012/0030408 A1 | 2/2012 | Flynn et al. | 711/102 |
| 2012/0185667 A1 | 7/2012 | Gandhi | 711/203 |
| 2013/0117503 A1 | 5/2013 | Nellans et al. | 711/103 |

* cited by examiner

*Primary Examiner* — Fritz Alphonse
(74) *Attorney, Agent, or Firm* — Christopher P. Maiorana, PC

(57) ABSTRACT

An apparatus includes one or more error-correction decoders, a buffer, and at least one processor. The buffer may be configured to store data to be decoded by the one or more error-correction decoders. The at least one processor is generally enabled to send messages to the one or more error-correction decoders. The messages may contain datapath control information corresponding to data in the buffer to be decoded by the one or more error-correction decoders. The one or more error-correction decoders are generally enabled to decode the data read from the buffer according to the corresponding datapath control information.

20 Claims, 7 Drawing Sheets

FIG. 9

| 31 | 28\|27 | 24\|23 | 20\|19 | 16\|15 | 12\|11 | 8\|7 | 4\|3 | 0 |
|---|---|---|---|---|---|---|---|---|
| LUT7 | LUT6 | LUT5 | LUT4 | LUT3 | LUT2 | LUT1 | LUT0 | |

FIG. 10

| 31 | 28\|27 | 24\|23 | 20\|19 | 16\|15 | 12\|11 | 8\|7 | 4\|3 | 0 |
|---|---|---|---|---|---|---|---|---|
| LUT15 | LUT14 | LUT13 | LUT12 | LUT11 | LUT10 | LUT9 | LUT8 | |

DYNAMIC PER-DECODER CONTROL OF LOG LIKELIHOOD RATIO AND DECODING PARAMETERS

This application relates to U.S. Ser. No. 14/092,215, filed Nov. 27, 2013, which relates to U.S. Provisional Application No. 61/902,407, filed Nov. 11, 2013, each of which is hereby incorporated by reference in their entirety.

FIELD OF THE INVENTION

The invention relates to solid state drive/disks (SSDs) generally and, more particularly, to a method and/or apparatus for implementing dynamic per-decoder control of log likelihood ratio (LLR) and decoding parameters.

BACKGROUND

With aggressive process scaling, raw bit error rate (RBER) of NAND flash is becoming poorer and poorer. To maintain the same level of reliability, solid state drive/disk (SSD) controllers are adopting soft decoded error correction codes, such as low density parity check (LDPC) codes. Soft decoded error correction codes are more powerful in correcting errors, but the input to the decoder needs to be soft information. The soft information is typically in the form of a log likelihood ratio (LLR). LDPC codes have been successfully used on hard disk drives (HDDs), where the LLRs of LDPC decoders are provided by a channel detector (typically a soft Viterbi decoder). A very sophisticated signal processing system handles channel variation and ensures that the LLRs input to the LDPC decoders are close to optimal. NAND flash channels are highly time variant due to a number of factors, such as retention, program and erase (P/E) cycling effect, read disturb, etc. A signal processing system similar to the one used in HDDs and applicable to NAND flash channels is not available. As a result, optimal reads cannot be guaranteed for all pages. Some pages can be read with high reliability, while others are not. A mechanism that is able to conveniently deliver different LLRs to LDPC decoders and conveniently control decoding parameters (such as number of iterations, scaling factor, bias of min-sum algorithm, etc.) is needed, in order to achieve the best uncorrectable BER (UBER) and the best throughput performance.

It would be desirable to have a method and/or apparatus for implementing dynamic per-decoder control of log likelihood ratio (LLR) and decoding parameters.

SUMMARY

The invention concerns an apparatus including one or more error-correction decoders, a buffer, and at least one processor. The buffer may be configured to store data to be decoded by the one or more error-correction decoders. The at least one processor is generally enabled to send messages to the one or more error-correction decoders. The messages may contain datapath control information corresponding to data in the buffer to be decoded by the one or more error-correction decoders. The one or more error-correction decoders are generally enabled to decode the data read from the buffer according to the corresponding datapath control information.

BRIEF DESCRIPTION OF THE FIGURES

Embodiments of the invention will be apparent from the following detailed description and the appended claims and drawings in which:

FIG. 9 is a diagram illustrating tag field format of the datapath header of an input stream 0 in accordance with an embodiment of the invention; and FIG. 10 is a diagram illustrating another tag field format of the datapath header of an input stream 1 in accordance with an embodiment of the invention.

DETAILED DESCRIPTION OF THE EMBODIMENTS

Embodiments of the invention include providing dynamic per-decoder control of log likelihood ratio (LLR) and decoding parameters that may (i) provide a messaging mechanism that communicates necessary information among hardware units so that the hardware units can work in a coordinated manner, (ii) provide a mechanism that is able to deliver LLRs and control decoding parameters for each codeword of each low density parity check (LDPC) decoder of a group, and/or (iii) be implemented as one or more integrated circuits.

Figure 1:
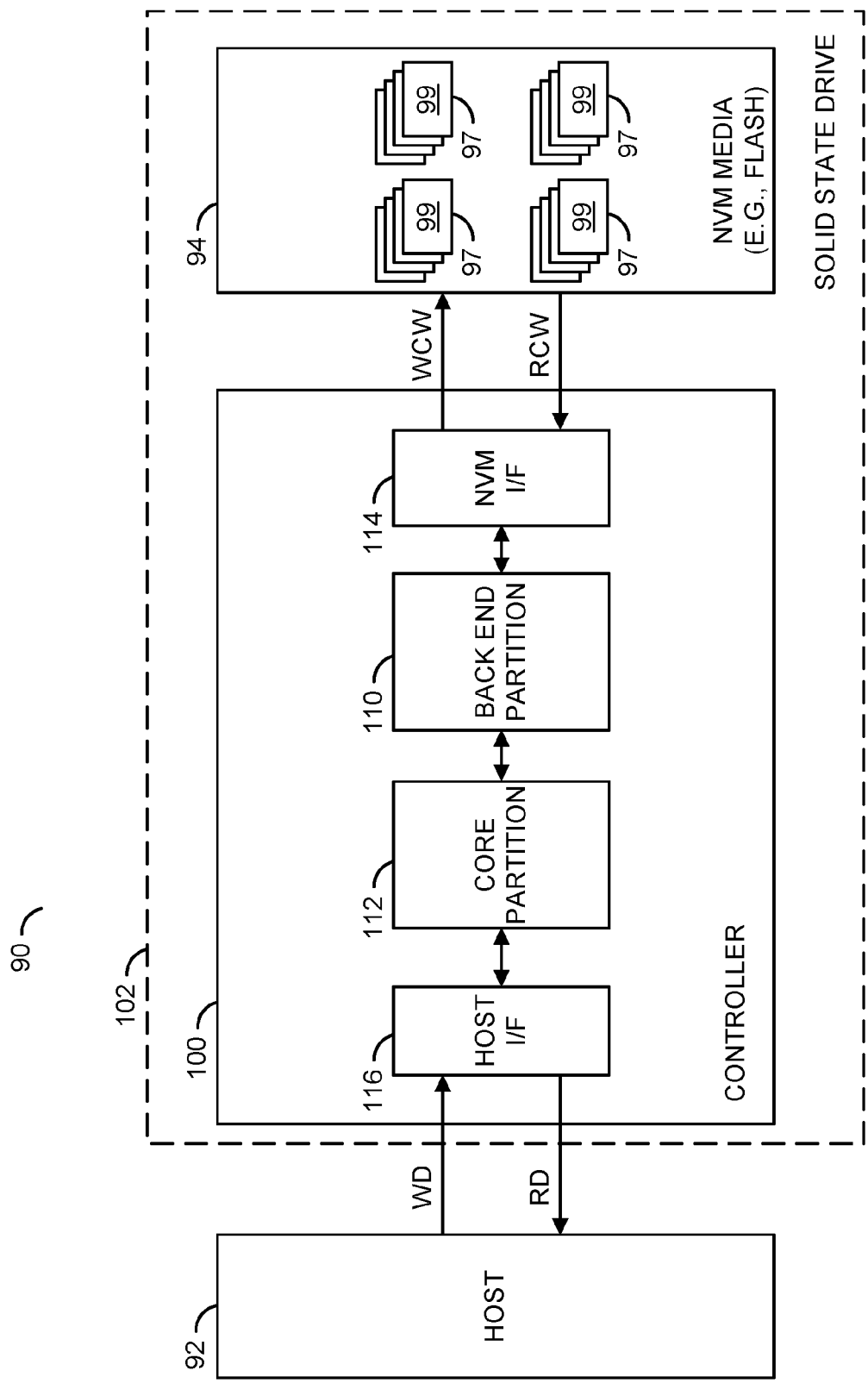
FIG. 1 is a diagram illustrating a storage controller including an example implementation of an apparatus in accordance with an embodiment of the invention.

Referring to FIG. 1, a block diagram is shown illustrating a system 90 having a storage controller including an example implementation of an apparatus in accordance with an embodiment of the invention. The system (or circuit or device or integrated circuit) 90 generally illustrates a computer system implemented with a non-volatile memory circuit. The system 90 generally comprises a block (or circuit) 92, a block (or circuit) 94, and a block (or circuit) 100. The circuits 92, 94, and 100 may represent modules and/or blocks that may be implemented as hardware (circuitry), software, a combination of hardware and software, or other implementations. A combination of the circuits 94 and 100 may form a solid state drive/disk (SSD) 102.

A signal (e.g., WD) is generated by the circuit 92 and presented to the circuit 100. The signal WD generally conveys write data to be written into the circuit 94. A signal (e.g., WCW) is generated by the circuit 100 and transferred to the circuit 94. The signal WCW generally carries error correction coded (e.g., ECC) write codewords written into the circuit 94. A signal (e.g., RCW) is generated by the circuit 94 and received by the circuit 100. The signal RCW carries error correction coded codewords read from the circuit 94. A signal (e.g., RD) is generated by the circuit 100 and presented to the circuit 92. The signal RD carries error corrected versions of the data in the signal RCW. The contents of the signals WD and RD are generally associated with write and read commands (or requests), respectively, from the circuit 92. The circuit 92 is shown implemented as a host circuit. In various embodiments, the circuit 92 includes one or any combination of a computer, a workstation computer, a server computer, a storage server, a personal computer (PC), a laptop computer, a notebook computer, a netbook computer, a personal digital assistant (PDA), a media player, a media recorder, a digital camera, a cellular handset, a cordless telephone handset, and an electronic game. The circuit 92 is generally operational to read and write data to and from the circuit 102. When writing, the circuit 92 presents the write data in the signal WD. The read data requested by the circuit 92 is received via the signal RD.

The circuit 100 is shown implemented as a controller circuit. The circuit 100 is generally operational to control reading from and writing to the circuit 94. The circuit 100 may be implemented as one or more integrated circuits (or chips or die). The circuit 100 is used for controlling one or more solid state drives, embedded storage, non-volatile memory devices, or other suitable control applications.

In various embodiments, the circuit 100 generally comprises a block (or circuit) 110, a block (or circuit) 112, a block (or circuit) 114, and a block (or circuit) 116. The circuit 110 implements a back-end partition of the controller circuit 100. The circuit 112 implements a core partition of the controller circuit 100. The circuit 114 implements a non-volatile memory (NVM) interface. The circuit 116 implements a host (or command) interface. In some embodiments, the circuit 114 and the circuit 116 are implemented as part of the circuits 110 and 112, respectively. The circuits 110 to 116 may represent modules and/or blocks that may be implemented as hardware, software, a combination of hardware and software, or other implementations.

The controller 100 is generally coupled to the NVM media 94 via one or more device interfaces implemented by the circuit 114. According to various embodiments, the device interfaces (or protocols) may include, but are not limited to, one or more of: an asynchronous interface; a synchronous interface; a double data rate (DDR) synchronous interface; an ONFI (open NAND flash interface) compatible interface, such as an ONFI 2.2 compatible interface; a Toggle-mode compatible non-volatile memory interface; a non-standard version of any of the preceding interfaces; a custom interface; or any other type of interface used to connect to storage devices. According to various embodiments, the device interfaces are organized as: one or more busses with one or more non-volatile memory devices 97 per bus; one or more groups of busses with one or more non-volatile memory devices 97 per bus, where busses in a group are generally accessed in parallel; or any other organization of non-volatile memory devices 97 coupled to then device interfaces of the circuit 114.

In general, the number of device interfaces implemented by the circuit 114 may be varied between embodiments. In various embodiments, the device interfaces are implemented as flash channels (or flash lanes), each of which has one or more flash devices 97, each of which has one or more flash die 99. For example, in some embodiments, each flash device 97 is configured as a single package with 2 channels and with 2N flash die 99, having N die on one channel, and N die on another channel. A package may be configured to support more than one channel to have more bandwidth. In various embodiments, board-level constraints may dictate a particular configuration, though factors like delivered bandwidth and capacity may come into play, too. For example, a non-volatile memory device 97 having four channels in one package (e.g., that might have 4 or 8 die—either 1 or 2 per channel) may be implemented in order to increase bandwidth (e.g., more channels) without increasing board real estate (e.g., occupying less area than 2 packages, each of which has only 2 channels). The device interfaces implemented in the circuit 114 may also be configured to couple read only memory (ROM) devices (not shown) providing portions of a non-user data area storing system data.

The controller 101 may be coupled to the host 92 via one or more external interfaces implemented by the circuit 116. According to various embodiments, the external interfaces (or protocols) implemented by the circuit 116 may include, but are not limited to, one or more of: a serial advanced technology attachment (SATA) interface; a serial attached small computer system interface (serial SCSI or SAS interface); a (peripheral component interconnect express (PCIe) interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the controller 100 includes a SATA interface and a PCIe interface.

The host interface 116 sends and receives commands and/or data via the external interface(s), and, in some embodiments, tracks progress of individual commands. For example, the individual commands may include a read command and a write command. The read command may specify an address (such as a logical block address, or LBA) and an amount of data (such as a number of LBA quanta, e.g., sectors) to read; in response the controller 100 provides read status and/or read data. The write command may specify an address (such as an LBA) and an amount of data (such as a number of LBA quanta, e.g., sectors) to write; in response, the controller 100 provides write status and/or requests write data and optionally subsequently provides write status. In some embodiments, the host interface 116 is compatible with a SATA protocol and, using NCQ commands, is enabled to have up to 32 pending commands, each with a unique tag represented as a number from 0 to 31. In some embodiments, the controller 100 is enabled to associate an external tag for a command received via the circuit 116 with an internal tag used to track the command during processing by the controller 100.

According to various embodiments, the back-end partition 110 includes at least one buffer, one or more processing units, and one or more error-correction (ECC) decoders (described below in connection with FIG. 2). The one or more back-end processing units may optionally and/or selectively process some or all data sent between the at least one back-end buffer and the circuit 114 and optionally and/or selectively process data stored in the at least one back-end buffer. According to various embodiments, the one or more ECC decoders optionally and/or selectively process some or all data sent between the at least one back-end buffer and the device interfaces of the circuit 114, and the one or more ECC decoders optionally and/or selectively process data stored in the at least one back-end buffer. In some embodiments, the one or more ECC decoders implement one or more of: a cyclic redundancy check (CRC) code; a Hamming code; an Reed-Solomon (RS) code; a Bose Chaudhuri Hocquenghem (BCH) code; an low-density parity check (LDPC) code; a Viterbi code; a trellis code; a hard-decision code; a soft-decision code; an erasure-based code; any error detecting and/or correcting code; and any combination of the preceding. In some embodiments, the back-end partition 110 uses one or more engines to perform one or more of: encrypting; decrypting; compressing; decompressing; formatting; reformatting; transcoding; and/or any other data processing and/or manipulation task.

In various embodiments, the circuit 114 may be configured to control one or more individual non-volatile memory lanes (channels). Each of the memory lanes is enabled to connect to one or more non-volatile memory devices. In some embodiments, the circuit 114 may implement multiple memory lane controller instances to control a plurality of non-volatile memory lanes. The non-volatile memory interface 114 is configured to couple the circuit 100 to the non-volatile memory media 94. The non-volatile memory media 94 may comprise one or more non-volatile memory devices 97. The non-volatile memory devices 97 have, in some embodiments, one or more non-volatile memory units (e.g., die, disk platter, etc.) 99. According to a type of a particular one of the non-volatile memory devices 97, a plurality of non-volatile memory units 99 in the particular non-volatile memory device 97 are optionally and/or selectively accessible in parallel. The non-volatile memory devices 97 are generally representative of one or more types of storage devices enabled to communicatively couple to the circuit 100. However, in various embodiments, any type of storage device is usable, such as SLC (single level cell) NAND flash memory, MLC (multi-level cell) NAND flash memory, TLC (triple level cell) NAND flash memory, NOR flash memory, electrically programmable read-only memory (EPROM or EEPROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium (e.g., other non-volatile memory devices, hard disk drives (HDDs), communications channels, etc.). Dynamic per-decoder control of log likelihood ratio (LLR) and decoding parameters in accordance with various embodiments of the invention may be applied to any application involving soft-decision (e.g., LDPC, etc.) decoding.

In some embodiments, the circuit 100 and the non-volatile memory media 94 are implemented on separate integrated circuits. When the circuit 100 and the non-volatile memory media 94 are implemented as separate integrated circuits (or devices), the non-volatile memory interface 114 is generally enabled to manage a plurality of data input/output (I/O) pins and a plurality of control I/O pins. The data I/O pins and the control I/O pins may be configured to connect the device containing the controller 100 to the external device(s) forming the non-volatile memory media 94. In various embodiments, the circuit 100 is implemented as an embedded controller. In various embodiments, the circuit 100 and the NVM media 94 implement the solid-state drive (SSD) 102.

The host interface 116 is configured to receive commands and send responses to the host 92. In embodiments implementing a plurality of non-volatile memory lanes, the back end partition 110 and the NVM interface 114 of the circuit 100 may implement multiplexing circuitry coupling multiple instances of memory lane controllers to a processing unit providing scheduling and/or data management of the plurality of non-volatile memory devices 97. In some embodiments, the processing unit comprises data buffering and direct memory access (DMA) engines to store data or other information and to move the data or other information between the host 92 and the NVM media 94 using one or more memory lane controllers within the circuit 100.

When a non-volatile memory read operation is performed (e.g., in response to a request originating either externally from the host 92 or internally from the circuit 100) raw data is retrieved from the NVM media 94 and placed in a buffer (e.g., within the circuit 110). In various embodiments, to ensure the data returned is correct, soft decision processing and soft decoder operations are performed in the circuit 100 to correct the raw data read from the NvM media 94. In some embodiments, a LDPC (low-density parity-check) code is used. The soft decoder operations performed in the circuit 110 generally operate on a granularity of a codeword (of fixed or variable size), referred to as an e-page.

In various embodiments, the non-volatile memory (NVM) die 99 comprise a number of planes (e.g., one, two, four etc.). Each plane comprises a number (e.g., 512, 1024, 2048, etc.) of NVM blocks. Each of the NVM blocks comprises a number of pages, such as 128, 256, or 512 pages. A page is generally the minimum-sized unit that can be independently written, and a block is generally the minimum-sized unit that can be independently erased. In various embodiments, each page of the non-volatile memory devices 97 comprises a plurality of e-pages, which may also be referred to as ECC-pages or "read units." Each e-page is an amount of user data and the corresponding ECC data that, together, comprise one ECC codeword (e.g., a correctable unit). Typically, there are an integer number of e-pages per NVM page, or in some embodiments, per multi-plane page. The e-pages are the basic unit that can be read and corrected, hence e-pages are also called read units. Typically, read units may have 1 KB or 2 KB of user data, and an even share of the remaining bytes in the non-volatile memory page (so that all read units in a same one of the multi-plane pages are the same total size). An e-page (or read unit) is thus the minimum-sized unit that can be independently read (and ECC corrected).

The circuit 114 is shown implemented as a non-volatile memory (e.g., Flash) interface circuit. In various embodiment, the circuit 114 is operational to provide communication with the circuit 94 via the signals WCW and RCW. Other signals may be implemented between the circuits 94 and 114 to meet the criteria of a particular application.

The circuit 116 is shown implemented as a host interface circuit. The circuit 116 is operational to provide communication with the circuit 92 via the signals WD and RD. Other signals may be implemented between the circuits 92 and 116 to meet the criteria of a particular application.

Figure 2:
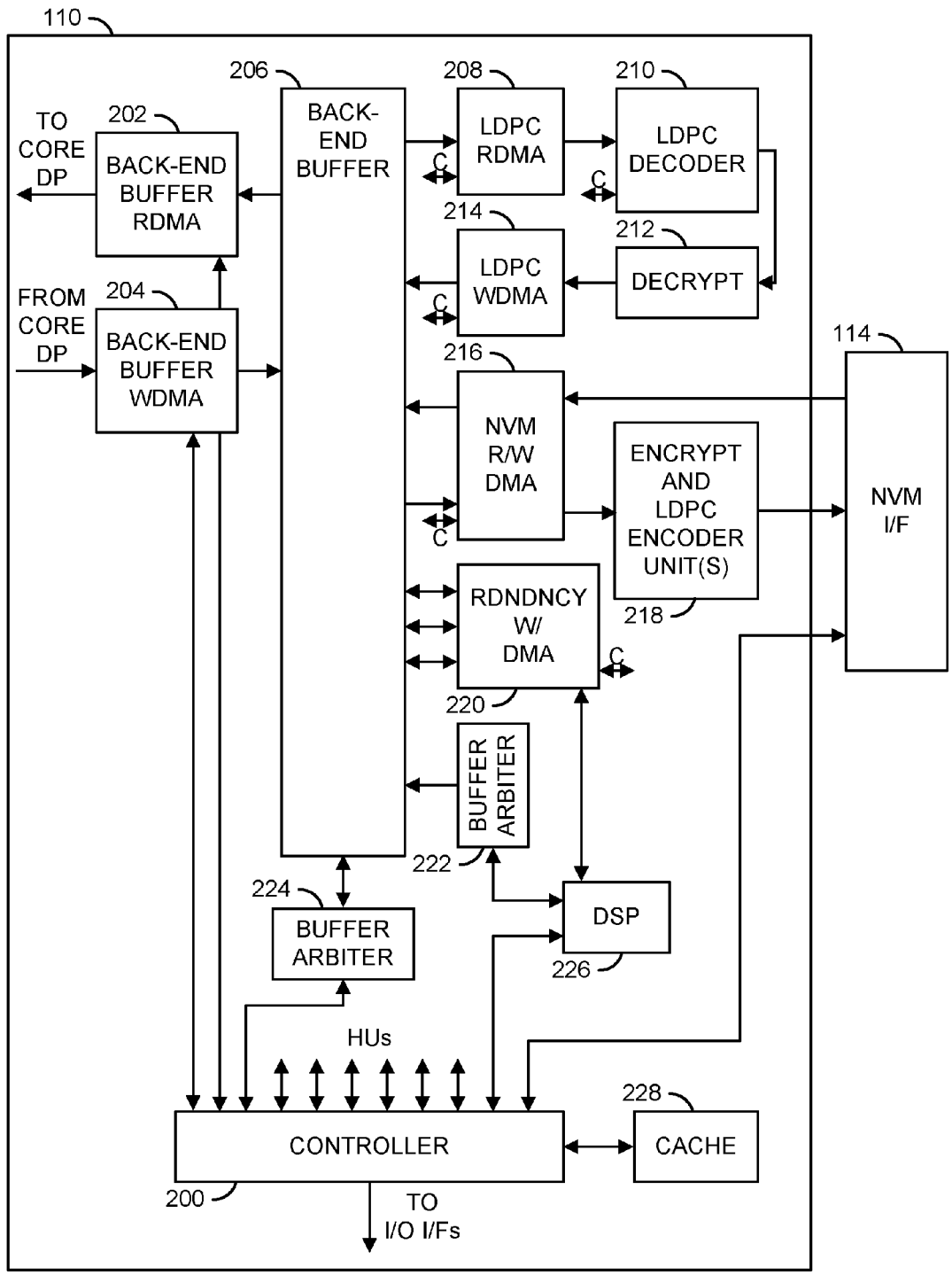
FIG. 2 is a diagram illustrating an example implementation of a back end partition of the storage controller of FIG. 1.

Referring to FIG. 2, a diagram illustrating an example implementation of a back end partition 110 of FIG. 1 is shown. In various embodiments, the circuit 110 comprises a block (or circuit) 200, a block (or circuit) 202, a block (or circuit) 204, a block (or circuit) 206, a block (or circuit) 208, a block (or circuit) 210, a block (or circuit) 212, a block (or circuit) 214, a block (or circuit) 216, a block (or circuit) 218, a block (or circuit) 220, a block (or circuit) 222, a block (or circuit) 244, a block (or circuit) 226, and a block (or circuit) 228. The circuits 200-228 may represent modules and/or blocks that may be implemented as hardware (circuitry), software, a combination of hardware and software, or other implementations.

The circuit 200 implements a controller (e.g., a back-end processing unit). The circuit 202 implements a back-end buffer read direct memory access (RDMA) engine. The circuit 204 implements a back-end buffer write direct memory access (WDMA) engine. The circuit 206 implements a memory buffer for the back-end partition 110, or more simply referred to as a back-end buffer. The circuits 202 and 204 couple the circuit 206 to a datapath (DP) of the core partition 112. The circuit 208 implements a LDPC RDMA engine. The circuit 210 implements a LDPC decoder. The circuit 212 implements a decryption (e.g., XTS, AES, etc.) engine. The circuit 214 implements a LDPC WDMA engine. The circuits 208 and 214 couple the circuits 210 and 212 to the circuit 206.

The circuit 216 implements non-volatile memory (NVM) read and write (R/W) direct memory access (DMA) engines. The circuit 218 implements encryption (e.g., XTS, AES, etc.) and LDPC encoder units (or engines) for each memory lane. The circuit 220 implements a higher-level error correction function. An example of a higher-level error correction function is a data redundancy scheme (e.g., a RAID (Redundant Array of Inexpensive (Independent) Disks)-like scheme capability, where redundancy is at a non-volatile memory device (e.g., multiple ones of the non-volatile memory devices 97) level and/or a non-volatile memory die (e.g., non-volatile memory die 99) level instead of at a disk level. In various embodiments, the circuit 220 includes DMA capability. The circuits 222 and 224 implement buffer arbiters. The circuit 226 implements a digital signal processing (DSP) subsystem. The circuit 228 implements a page cache. The circuit 228 may be configured to control caching of both NVM pages and e-pages (e.g., in the buffer 206).

The circuit 200 is generally coupled to a number of the circuits (or hardware units) 202-226 via a message fabric (e.g., illustrated by a connecting line, or a double arrowhead with the letter "C") and message FIFOs (first-in-first-out buffers). The circuit 200 is generally configured to send messages to the hardware units (HUs) to control, modify, and/or adjust operations of the HUs. In some embodiments, the messages and message fabric may be implemented as part of a unified message-based communication scheme, an example of which is described in co-owned and co-pending U.S. application Ser. No. 13/864,494, filed Mar. 17, 2013, which is herein incorporated by reference in its entirety.

In various embodiments, the circuit 200 is configured to communicate log likelihood ratio values (LLRs) to the LDPC decoder circuit 210 and control decoding parameters of the LDPC decoder circuit 210 using messages in accordance with various embodiments of the invention. Messages from the circuit 200 to the circuit 210 are delivered to the circuit 210 via the message fabric and the circuit 208. Messages (or data) from the circuits 210 and 212 to the circuit 200 may be delivered to the circuit 200 via the back-end buffer 206, the circuit 214, and/or the message fabric.

The circuit 206 is operational to buffer (store) codewords received from the circuit 94 via the circuits 114 and 216. The circuit 208 is operational to buffer (store) decoding parameters generated by the circuit 200. Delivery of (i) the codewords read from the back-end buffer 206 and (ii) the decoding parameters generated by the circuit 200 for use in the circuit 210 is controlled by the circuit 208. For example, the circuit 208 coordinates (i) reading data from the back-end buffer 206 based on control information from the circuit 200 and (ii) sending the data read from the back-end buffer 206 along with a portion of the control information (e.g., LLR values, decoding parameters, etc.) to the LDPC decoder circuit 210.

The LLR values are used in a soft-decision decoding process performed by the circuit 210. In some embodiments, instead of the decoding parameters being presented by the circuit 200 to the circuit 208 for storage, the decoding parameters may be presented to circuit 210 directly (not illustrated). The circuit 208 provides codewords read from the circuit 206 to the circuit 210 along with the corresponding decoding parameters. In various embodiments, the circuit 200 is implemented as a dedicated hardware unit, an embedded controller, a processor core (e.g., an ARM core, an Xtensa core, etc.), or a custom designed circuit. In various embodiments, the circuit 200 may comprise one or more single-core or multi-core processors. The individual processor cores in the circuit 200 are, in some embodiments, multi-threaded. The circuit 200 includes instruction and/or data caches and/or memories. For example, the instruction memory contains instructions to enable the circuit 200 to execute software (sometimes called firmware) to control the controller 100. In some embodiments, some or all of the firmware executed by the circuit 200 is stored on the non-volatile memory devices 97. The circuit 200 is enabled to determine the decoding parameters from one or more of: statistics generated by the circuit 114 for the codewords read from the circuit 94; knowledge of voltage reference(s) used to read the circuit 94; knowledge of results of previous decoding attempts; other hardware units and/or engines; and any other techniques.

Figure 3:
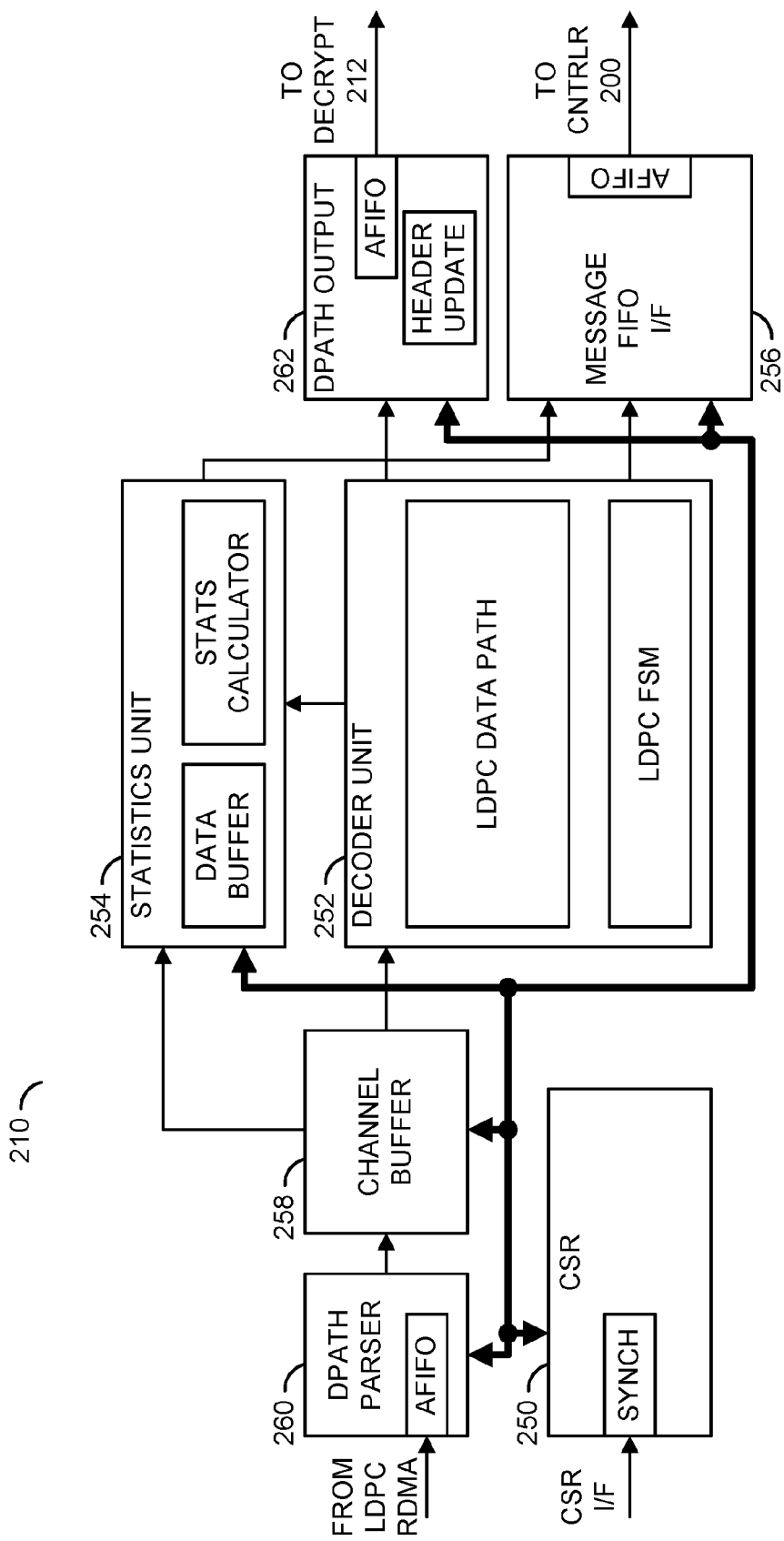
FIG. 3 is a diagram illustrating an example implementation of a low density parity check (LDPC) decoder of FIG. 2.

Referring to FIG. 3, a diagram illustrating an example implementation of the low density parity check (LDPC) decoder 210 of FIG. 2 is shown. In various embodiments, the circuit 210 comprises a block (or circuit) 250, a block (or circuit) 252, a block (or circuit) 254, a block (or circuit) 256, a block (or circuit) 258, a block (or circuit) 260, and a block (or circuit) 262. The circuits 250-262 may represent modules and/or blocks that may be implemented as hardware (circuitry), software, a combination of hardware and software, or other implementations. In various embodiments, the block 250 implements a configuration and status register (CSR) interface, the block 252 implements a decoder unit, the block 254 implements a statistics unit, the block 256 implements a message FIFO interface, the block 258 implements a channel buffer, the block 260 implements a datapath parser/control block, and the block 262 implements a datapath output block. The configuration and status register (CSR) interface 250 allows for static configuration. The datapath parser/control block 260 and datapath output block 262 include asynchronous first-in-first-out (FIFO) input and output interface modules, respectively.

In various embodiments, the circuit 210 receives input from the circuit 208, decodes the user data that was originally stored in the NVM media 94, calculates the statistics for the data decoded, and then sends the data to be decrypted by the circuit 212. The circuit 210 reports decoding statistics partially through status messages appended at the end of a last e-page for an OpTag (a group of related e-pages such as e-pages from the same NVM page) to be sent later as status to the circuit 200 by the circuit 214. If an uncorrectable or single event upset (SEU) is encountered, the circuit 210 sends additional information to the circuit 200 through the message FIFO interface 256. In various embodiments, the interfaces to the circuit 210 are asynchronous allowing the circuit 210 to run at a different operating frequency than the rest of the back-end partition 110. The inputs need to be synchronized before being used and the outputs need to be synchronized after being produced for the rest of the partition 110.

In various embodiments, the circuit 210 implements a process (e.g., an iterative decoding procedure) to determine the codeword closest (e.g., with maximum likelihood) to an e-page read from the NVM media 94. If the circuit 210 finds a closest codeword within a specified maximum number of iterations, decoding succeeds (and the e-page is corrected).

If the specified maximum number of iterations is reached without having found a closest codeword, the circuit 210 declares that the e-page is uncorrectable. The circuit 210 also collects statistics and performs error reporting on data that is manipulated.

The datapath parser/control block 260 parses a datapath header received from the circuit 208. The datapath parser/control block 260 comprises header parser logic which extracts decoding parameters (e.g., user data length, code rate used to encode the user data, etc.) from the datapath header. The datapath parser/control block 260 is enabled to pad the input user data (e.g., to a LDPC circulant boundary) and/or to adjust operation of the decoder unit 252 to account for the length of the user data (e.g., when the user data is shorter than a maximum user data size of the decoder unit 252). The datapath parser/control block 260 may contain FIFOs and/or other circuitry for rate matching between the output of the LDPC RDMA circuit 208 and the rest of the circuit 210. The decoding parameters include LLR values used for hard-decision decoding, such as the LLR value assigned to a hard-decision 0, and the LLR value assigned to a hard-decision 1. The decoding parameters may include other parameters for per e-page control of the circuit 210, such as a maximum number of iterations, whether the input data is hard-decision or is already in soft-decision (e.g., LLR) format, what type of output is to be generated, etc. An example format of the data contained in the datapath header is explained in the following sections.

The channel buffer 258 is responsible for converting hard-decision input bits into soft-decision (e.g., LLR) format values to be decoded by the decoder unit 252. The channel buffer 258 converts the hard-decision inputs according to the decoding parameters provided by the datapath parser/control block 260. The decoder unit 252 manipulates the soft-decision format values stored in the channel buffer 258 to recover the original data that is stored out in the NVM media 94. The statistics unit 254 generates various statistics, including:

(a) Total e-pages processed—32 bit;
(b) Number of uncorrectable e-pages—32 bit;
(c) Total bit errors corrected—33 bit counter;
(d) Histogram of error distribution observed with
  (i) 2 sets of 64 buckets, −1 for ESTAT, and 1 for non-ESTAT,
  (ii) programmable increments of power-of-two size from 1 to 64,
  (iii) a last bucket for anything larger than 64, and
  (iv) a default increment of 4;
(e) Total number of iterations used;
(f) Expect 0 BER—32 bit counters;
(g) Total Epage soft decision decoded—32 bit;
(h) Total number of iterations used for corrected e-pages—32 bit counters.

The statistics unit 254 collects all statistics in the LDPC decoder circuit 210 including per "OpTag" statistics as listed above.

The datapath output block 262 formats all the decoded data and adds ECC protection so that the decoded data can be sent to the circuit 212 for decryption. The datapath output block 262 is also responsible for aggregating the statistics and updating the header to be sent to the circuit 212. Additionally, the datapath output block 262 appends statistics for the OpTag being decoded. The datapath output block 262 synchronizes the data to the rest of the circuit 100 through an asynchronous FIFO interface.

In addition to the dynamic control provided via the datapath, the CSR interface 250 implements all the registers needed to statically configure/debug the circuit 210 as well as system level interrupts and functionality specified of all modules. The message FIFO interface 256 is responsible for sending additional error statistics to the circuit 200 if the message FIFO interface 256 sets the uncorrectable bit. The message FIFO interface 256 sends an e-page error map as well as the total number of checkbits not converging per e-page.

Figure 4:
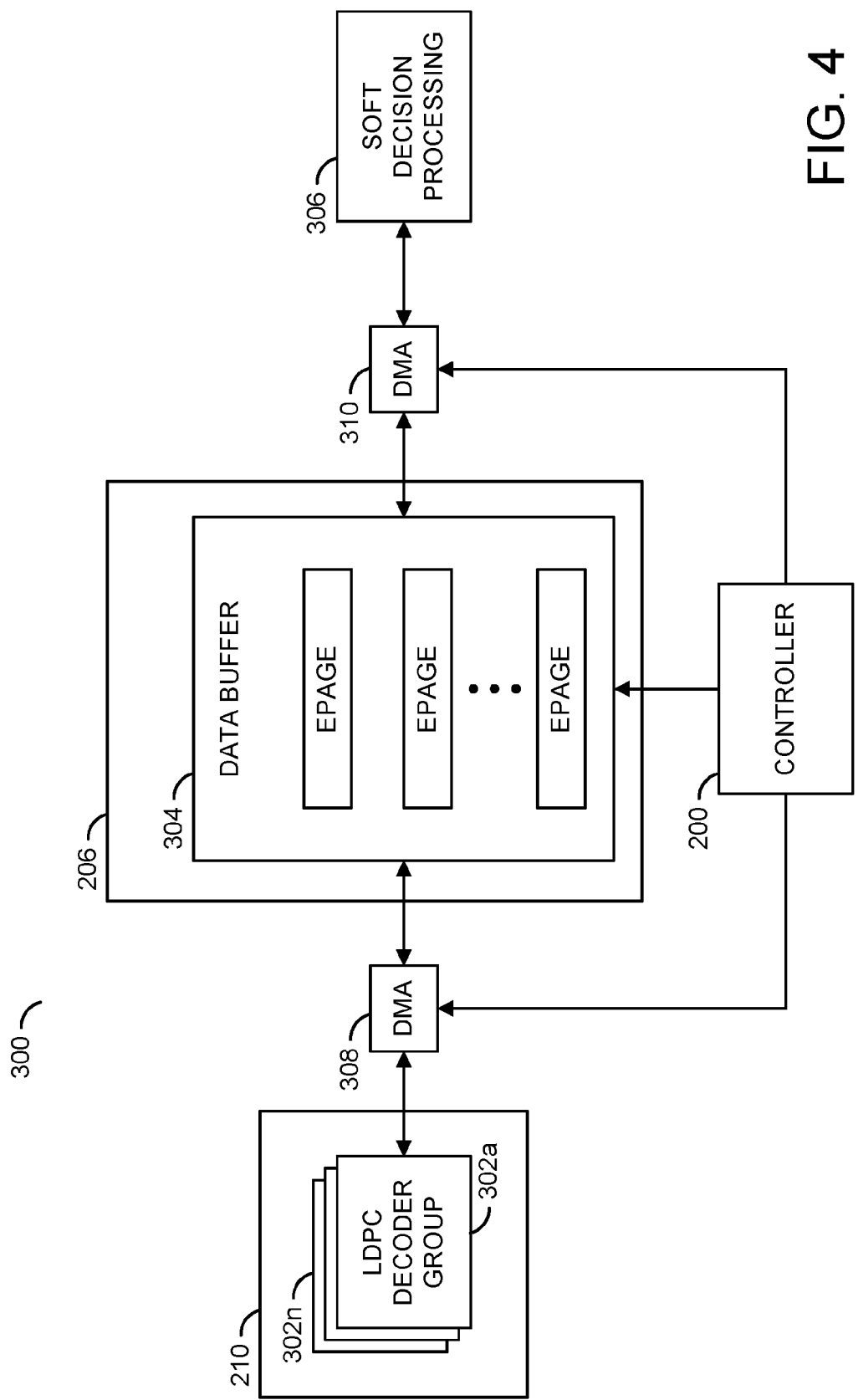
FIG. 4 is a diagram illustrating a conceptual view of LPDC decoders and a soft decision processing system in accordance with an embodiment of the present invention.

Referring to FIG. 4, a diagram is shown illustrating a conceptual view of a soft-decision decoding and soft-decision processing system 300 implemented in accordance with an embodiment of the invention. In various embodiments, the system 300 may be implemented using the controller 200, the back-end buffer 206, and the LDPC decoder circuit 210 (described above in connection with FIG. 2). The LDPC decoder circuit 210 may be implemented as a group of one or more LDPC decoders 302a-302n. A portion of the back-end buffer 206 may be configured as a data buffer 304. The data buffer 304 is coupled to the controller 200 and is configured to store codewords (e-pages). The data buffer 304 is also coupled to the circuit 210 and a soft decision processing unit 306 via read and write DMA blocks 308 and 310, respectively. The read and write DMA block 308 may be implemented by the LDPC RDMA circuit 208 and the LDPC WDMA circuit 214 (described above in connection with FIG. 2). The soft decision processing unit 306 and the read and write DMA block 310 may be implemented by the circuit 220 of FIG. 2.

The soft decision processing unit 306 is enabled to convert multiple hard-decision reads of an e-page performed at different read reference voltage levels into corresponding LLR values for each bit of the e-page. To maximize flexibility of the soft decision processing unit 306, the LLR values are provided as a look-up table that may be changed for each e-page being processed, such as according to the specific reference voltage levels used for each of the multiple hard-decision reads. The LLR values are passed to the soft decision processing unit 306 through tag fields of the datapath headers of input stream0 and input stream1 (described below in connection with FIGS. 9 and 10).

In various embodiments, dynamic control of the one or more LDPC decoders 302a-302n is enabled by a message protocol. Messages are the basic unit of operation-specific communication between processors or other units in the architecture of the storage controller 100. The message-based communication in the architecture is configured to provide control to direct operations from initiation to conclusion, without causing undue overhead. For this reason, many messages from a requester are processed and forwarded one or more times without sending acknowledgments back immediately—the final unit to receive a forwarded message is the only one that replies to the original requester.

Messages are sent as a number of 64-bit words, with the first 64-bit word specifying the message control and type information, as well as a count of the number of following 64-bit words in the message. Things are not quite as simple as the above due to additional information, such as control for compression/decompression and encryption/decryption, that must be embedded in the data stream. For this reason, the datapaths in the storage controller 100 use a header to separate transfers, and the header carries additional information specific to each transfer.

An overview of a datapath header format in accordance with an embodiment of the invention is described below in connection with FIG. 5. Message/datapath headers are allocated and managed by processors. When data streams are traveling between the data buffer 304 and the one or more LDPC decoders 302a-302n, or between the data buffer 304 and the soft decision processing unit 306, the controller 200 instructs the read/write DMAs 308 and 310, respectively, to generate datapath headers with proper control information and attach the headers to the beginning of the data streams. The one or more LDPC decoders 302a-302n and the soft decision processing unit 306 should have corresponding datapath header extractors (not shown) which extract the control information. In this way, the control information is bundled to the data streams and is maintained in phase with the corresponding data. Each of the one or more LDPC decoders 302a-302n determine respective decoding parameters according to the datapath header received.

In general, the one or more LDPC decoders 302a-302n should have a set of global decoding parameters which normally are configured by registers. The one or more LDPC decoders 302a-302n are generally very busy with normal read decoding and/or with various data recovery decoding. Decoding a codeword in recovery mode usually needs special values of the parameters. Therefore, if the special values are set by programming the global registers, all the decoders have to perform their tasks serially, which is not acceptable from the view point of throughput performance. Example parameters that are dynamically controlled by the datapath headers are described below in connection with FIGS. 5-10.

Figure 5:
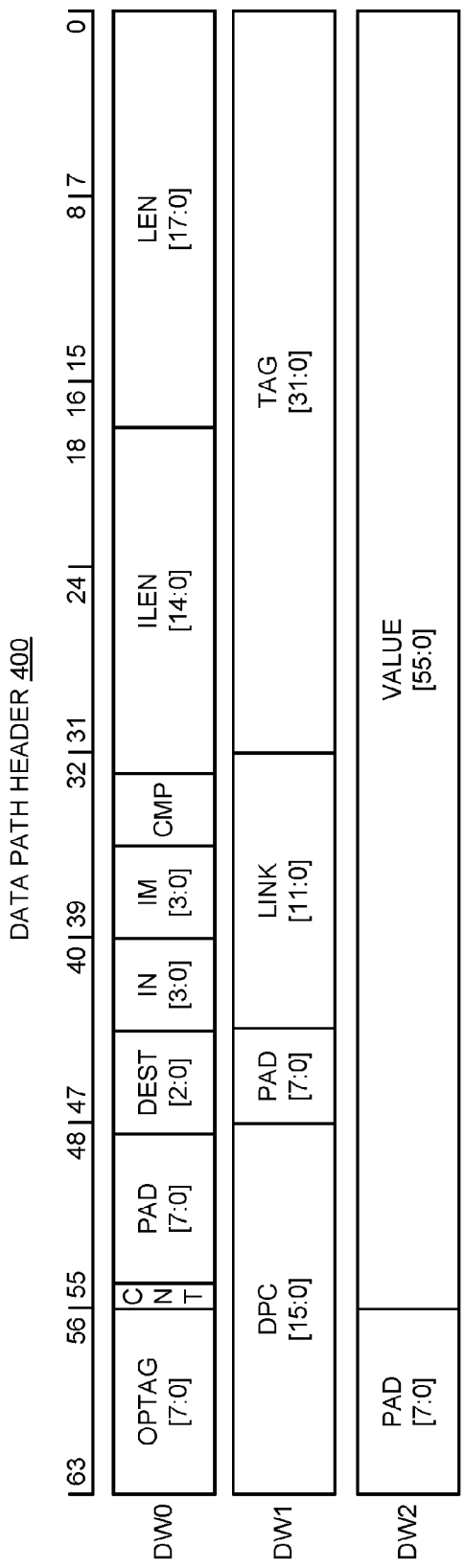
FIG. 5 is a diagram illustrating a datapath header in accordance with an embodiment of the invention.

Referring to FIG. 5, a diagram is shown illustrating a datapath header 400 formatted in accordance with an embodiment of the invention. A particular datapath header 400 is generated by a respective DMA engine according to a respective datapath protocol. With respect to the LDPC decoder 210 of FIG. 3, the particular datapath header 400 is generated by the LDPC RDMA block (e.g., the circuit 208 in FIG. 2) and sent to the LDPC decoder (e.g., the circuit 210 in FIG. 2) for decoding. In various embodiments, the datapath header 400 comprises two or three 64-bit words (e.g., DW0, DW1, and DW2). The third 64-bit word DW2 is present if the CNT field in DW0 is non-zero. For example, in various embodiments, LDPC decoding and soft-decision processing do not use the third 64-bit word DW2.

The first 64-bit word, DW0, comprises an operation tag field (e.g., OPTAG), a field indicating a number of following Dwords (e.g., CNT), a destination identifier field (e.g., DEST), an item number field (e.g., IN), an item mask field (e.g., IM), a compression field (e.g., CMP), an item length field (e.g., ILEN), and a byte length field (e.g., LEN). The IN field may be used to specify the last host page in a current frame or indicate that data is not in host pages. The IM field may be used to identify which host pages in compression unit should be returned. The CMP field may be used to specify an encoded version of how many compression units are in the data frame. The ILEN field may be used to indicate a length of each item within a datapath frame. The LEN field may be used to indicate a byte length of data in the frame (e.g., user data checkbits). In general, messages related to the LDPC decoder and soft decision processing would primarily utilize the OPTAG and LEN fields and values from the second 64-bit word DW1.

The second 64-bit word, DW1, may comprise a datapath control field (e.g., DPC), a link field (e.g., LINK), and a tag field (e.g., TAG). The DPC field may be used differently by each DMA channel. The LINK field may be used to specify link data, used primarily by the core partition. The TAG field may be used to store information related to data in the frame. For example, the information may include a header tag (e.g., host post address), index information for mapping related writes, salt information for encryption and decryption, etc. The third 64-bit word may comprise a value field (e.g., VALUE). The VALUE field may be used to pass special values (e.g., DMA dependent), an epoch value, a buffer address, special status information, etc.

The datapath parser/control block 260 extracts the parameters in a datapath control field (e.g., DPC) portion as well as a length field (e.g., LEN) portion of the datapath header 400 to obtain the datapath length and code rate information needed to decode the user data. The bits [17:0] of the LEN field in DW0 of the datapath header are used to indicate the total data byte length of the codeword being decoded—user data and check bytes for hard decision input. For soft decision data, 4 bits of input are used to represent 1 bit of data to be decoded.

For a normal read of NAND flash, the read back data is a binary sequence (e.g., 0s and 1s). The binary sequence can be directly mapped into log likelihood ratios (LLRs). For example, all 0s may be mapped to −6, and all ones mapped to +6. Using LLR values for hard-decision (e.g., binary data) LDPC decoding advantageously enables different LLR values to be used according to information such as voltage references used to read the NVM media 94, expected charge distributions of programmed cells in the NVM media 94, information from previous LDPC decodings, and other information. The LLRs used for hard-decision decoding may not be as precise as those used for soft-decision decoding where multiple reads of the NVM media 94 with varying read reference voltages (e.g., Vrefs) are performed. The results of the multiple reads (each in binary form) are combined to produce a more accurate soft-decision LLR value for each bit. LDPC decoding performed using the soft-decision LLR values is called soft-decision LDPC decoding.

Figure 6:
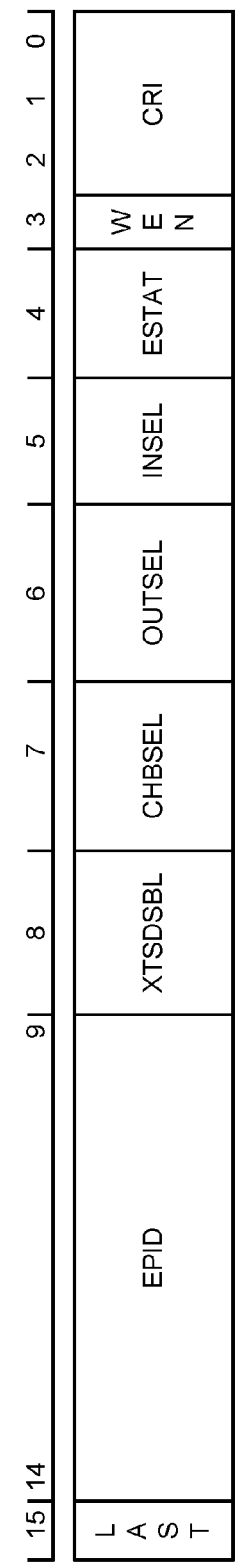
FIG. 6 is a diagram illustrating a datapath control format in accordance with an embodiment of the invention.

Referring to FIG. 6, a diagram is shown illustrating an example format of the datapath control (DPC) field of the datapath header 400 of FIG. 5. A DMA unit in accordance with an embodiment of the invention is configured to generate datapath headers and send the datapath headers, in phase with the corresponding data, to the one or more LDPC decoders. In various embodiments, the parameters controlled by the DPC field include, for example, code rate selection (CRI), statistics selection (ESTAT), soft/hard input selection (INSEL), output selection (OUTSEL), check byte selection (CHBSEL), write DMA enable (WEN), and descrambler (e.g., decryption) control (XTSDSBL). The parameters used by the LDPC decoders to operate are generally given in the first and second words (DW0 and DW1) of the datapath header from the DMA module.

The bits [63:48] of the datapath header word DW1 (represented as the parameter DPC in FIG. 5) are parsed and a code rate parameter is extracted from the CRI portion of the DPC field. In some embodiments, the CRI field is implemented as 3 bits (e.g., [2:0]) that indicate the code rate to be used for decoding. Bit [3] implements a DMA write enable bit (e.g., WEN) that may act as a back-end write DMA enable or status reporting bit when asserted (enabled). Bit [4] may be used to enable statistics collection. By asserting bit [4], firmware (F/W) is enabled to tell the LDPC decoder when to enable extended statistics counting. Bit [4] allows F/W to filter and bin as the F/W deems necessary. Bit [5] may be used to indicate to the LDPC decoder whether a soft or hard decision is being sent on the datapath input from the RDMA engine. Bit [6] may be used for indicating whether the output is a hard or soft decision. Bit [7] may be used to enable the checkbits to be sent out so that digital signal processing (DSP) may be performed. In some embodiments, bit [7] can only be asserted when bit [8] is asserted. Bit [8] may be used to enable/disable decryption (descrambling). Bits [14:9] may be used to indicate the e-page within an OpTag being sent. Bit [15] may be used to indicate when a last e-page within an OpTag is reached.

Figure 7:
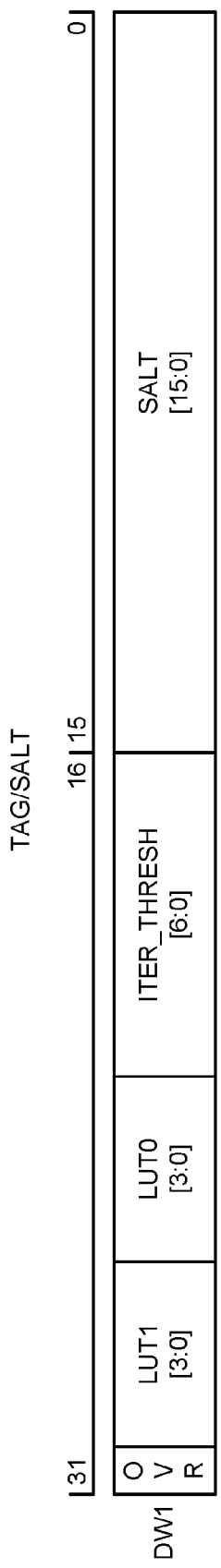
FIG. 7 is a diagram illustrating a TAG/SALT format for dynamic control of LLR support in accordance with an embodiment of the invention.

Referring to FIG. 7, a diagram is shown illustrating an example format of the TAG field portion (e.g., bits [31:0] of DW1) of the datapath header 400 when used with the LDPC decoder 210. In addition to the DPC-based control, in order to support dynamic LLR, a number of bits (e.g., the 16 most significant bits (MSBs), bits [31:16]) of the header DW1 TAG field may be used to provide additional control information. The DPC field is unchanged. Rather than changing any existing CSR-based control, the DW1 TAG field includes an over-ride bit (e.g., OVR) which, when asserted, may use other bits of the TAG field to replace the static (CSR-configured) LDPC Decode LUT values and iteration count when hard-decision input is selected in the DPC. The LUT values are used only to map hard decision input to the decoder. The LUT values in the header are not used for padding by the decoder. The padding continues to use CSR-controlled LLR values.

In various embodiments, the TAG field may be used to convey the over-ride bit (OVR), LLR values for hard decision 0 and 1 (e.g., LUT0 and LUT1), and salt for the descrambler (e.g., SALT). When the over-ride bit OVR is cleared, the one or more LDPC decoders 300a-300n are allowed to use the default values of LUT0 and LUT1 set by the CSRs. When the over-ride bit OVR is set, the values used by the one or more LDPC decoders 300a-300n are defined by the TAG field. For example, the LUT0 and LUT1 fields over-ride the decision values in the CSRs and the ITER_THRESH field over-rides the CSR-controlled number of iterations.

Figure 8:
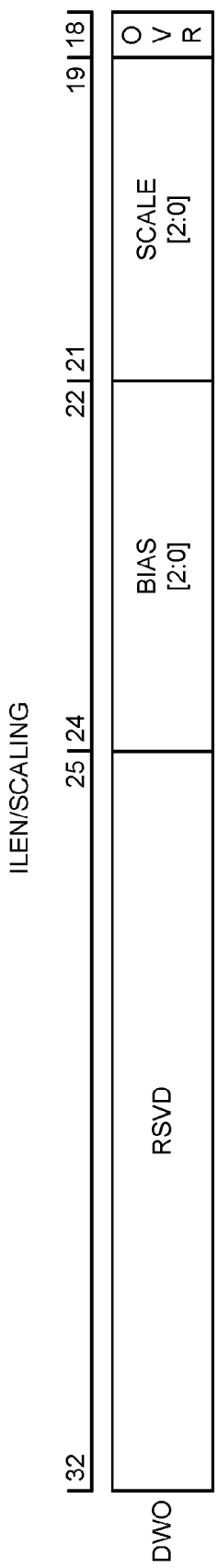
FIG. 8 is a diagram illustrating a dynamic scaling/bias header format in accordance with an embodiment of the invention.

Referring to FIG. 8, a diagram is shown illustrating an example format of a ILEN/SCALING field of the datapath header 400. The ILEN/SCALING field also includes an over-ride bit (OVR). If the over-ride bit OVR of the ILEN/SCALING field is set, the one or more LDPC decoders 300a-300n use the BIAS and SCALE values carried by the ILEN/SCALING field rather than default CSR-defined values.

Referring to FIGS. 9 and 10, diagrams are shown illustrating example formats of TAG fields of the datapath header from the DMA block 310 to the soft decision processing unit 306. The soft-decision processing unit 306 is enabled to convert multiple hard-decision reads of an e-page performed at different read reference voltage levels into corresponding LLR values for each bit of the e-page. To maximize flexibility of the soft-decision processing unit 306, the LLR values are provided as a look-up table that may be changed for each e-page being processed, such as according to the specific reference voltage levels used for each of the multiple hard-decision reads. The LLR values are passed to the soft decision processing unit 306 through the tag fields of the datapath headers of input stream0 (FIG. 9) and input stream1 (FIG. 10).

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions performed by the diagrams of FIGS. 1-10 may be implemented (or modeled) using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

While the invention has been particularly shown and described with reference to embodiments thereof, it will be understood by those skilled in the art that various changes in form and details may be made without departing from the scope of the invention.

The invention claimed is:

1. An apparatus comprising:
   one or more error-correction decoders;
   a buffer configured to store data to be decoded by the one or more error-correction decoders; and
   at least one processor enabled to send messages to the one or more error-correction decoders, the messages containing datapath control information corresponding to data in the buffer to be decoded by the one or more error-correction decoders, wherein the one or more error-correction decoders are enabled to decode the data read from the buffer according to the corresponding datapath control information.

2. The apparatus according to claim 1, wherein the messages deliver log-likelihood ratio (LLR) values and control decoding parameters for each codeword decoded by each of the one or more error-correction decoders.

3. The apparatus according to claim 1, wherein the decoding parameters include one or more of LLR values used for hard decision decoding, maximum number of iterations, whether input data is a hard decision or in soft decision format, and a type of output to be generated.

4. The apparatus according to claim 1, wherein each of the one or more error-correction decoders comprises at least one asynchronous first-in-first-out (FIFO) input buffer and at least one asynchronous FIFO output buffer allowing the one or more error-correction decoders and the at least one processor to operate at different frequencies.

5. The apparatus according to claim 1, wherein the one or more error-correction decoders are configured to report decoding statistics to the at least one processor using status messages.

6. The apparatus according to claim 5, wherein the one or more error-correction decoders are configured to use messages to send additional information to the at least one processor in response to encountering an uncorrectable or single event upset.

7. The apparatus according to claim 6, wherein each of the one or more error-correction decoders comprises a datapath parser control block enabled to perform one or more of extracting decoding parameters from a datapath header, padding user input data, adjusting operation of a decoder unit to account for user data length, and rate matching between the one or more error-correction decoders and circuitry presenting inputs to the one or more error-correction decoders.

8. The apparatus according to claim 7, wherein each of the one or more error-correction decoders further comprises a channel buffer configured to convert hard-decision input bits into soft-decision format values to be decoded by the decoder unit.

9. The apparatus according to claim 8, wherein the channel buffer converts the hard-decision input bits according to decoding parameters provided by the datapath parser control block.

10. The apparatus according to claim 1, wherein each of the one or more error-correction decoders comprises a statistics unit enabled to generate decoding-related statistics including one or more of:

a total number of read units processed;
a number of uncorrectable read units;
a total number of bit errors corrected;
a histogram of an error distribution observed;
a total number of iterations used;
a total number of read units soft-decision decoded; and
a total number of iterations used for corrected read units.

11. The apparatus according to claim 1, wherein each of the one or more error-correction decoders comprises a datapath output block, wherein the datapath output block is configured to format decoded data and add error correction code (ECC) protection, send the decoded data with ECC protection to a decryption circuit, aggregate decoding statistics generated by a respective error-correction decoder, and update header information sent to the decryption circuit.

12. The apparatus according to claim 1, wherein each of the one or more error-correction decoders comprises a message FIFO interface configured to send error statistics to the at least one processor, the error statistics including one or more of a read page error map and a total number of checkbits not converging per read unit.

13. The apparatus according to claim 1, wherein the apparatus is part of a storage controller.

14. The apparatus according to claim 1, wherein:
   the apparatus is enabled to read data from and write data to one or more non-volatile storage media; and
   the buffer is configured to hold the data read from the non-volatile storage media.

15. A method of dynamic per-decoder control of decoding parameters in a non-volatile memory controller comprising the steps of:
   executing one or more instructions using at least one processor coupled to one or more error-correction decoders, wherein the one or more instructions cause the at least one processor to generate one or more messages related to controlling the decoding parameters of the one or more error-correction decoders; and
   decoding one or more codewords in the one or more error-correction decoders in response to the one or more messages generated by the at least one processor.

16. The method according to claim 15, wherein the messages deliver log-likelihood ratio (LLR) values and control decoding parameters for each codeword decoded by each of the one or more error-correction decoders and the decoding parameters include one or more of LLR values used for hard decision decoding, maximum number of iterations, whether input data is a hard decision or in soft decision format, and a type of output to be generated.

17. The method according to claim 16, wherein each of the one or more error-correction decoders is enabled to perform one or more of:
   extracting decoding parameters from a datapath header;
   padding user input data;
   adjusting operation of a decoder unit to account for user data length; and
   rate matching between the one or more error-correction decoders and circuitry presenting inputs to the one or more error-correction decoders.

18. The method according to claim 15, wherein the non-volatile memory controller is part of a solid state drive.

19. An apparatus comprising:
   a non-volatile memory configured to process a plurality of read/write operations; and
   a controller operatively coupled to the non-volatile memory, wherein the controller comprises one or more error-correction decoders, a buffer configured to store data to be decoded by the one or more error-correction decoders, and at least one processor enabled to send messages to the one or more error-correction decoders, wherein the messages are configured to deliver datapath control information, the data is read from the buffer and delivered to the one or more error-correction decoders, and the one or more error-correction decoders are enabled to decode the data read from the buffer according to the datapath control information.

20. The apparatus according to claim 19, wherein the non-volatile memory and the controller implement a solid-state disk.

* * * * *